(12) United States Patent
Hamada

(10) Patent No.: US 8,698,976 B2
(45) Date of Patent: Apr. 15, 2014

(54) LIGHT EMITTING DEVICE, ILLUMINATING APPARATUS HAVING THE SAME, AND LIQUID CRYSTAL DISPLAY APPARATUS

(75) Inventor: Tetsuya Hamada, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 933 days.

(21) Appl. No.: 12/295,758

(22) PCT Filed: Dec. 20, 2006

(86) PCT No.: PCT/JP2006/325363
§ 371 (c)(1),
(2), (4) Date: Oct. 2, 2008

(87) PCT Pub. No.: WO2007/135764
PCT Pub. Date: Nov. 29, 2007

(65) Prior Publication Data
US 2009/0244439 A1 Oct. 1, 2009

(30) Foreign Application Priority Data

May 24, 2006 (JP) ................................. 2006-143646

(51) Int. Cl.
*G02F 1/1335* (2006.01)
*F21S 19/00* (2006.01)
*F21V 7/04* (2006.01)
*H01J 61/94* (2006.01)

(52) U.S. Cl.
USPC ............... 349/65; 349/61; 362/227; 362/611; 313/1

(58) Field of Classification Search
USPC ................... 349/61, 65; 362/227, 611; 313/1
See application file for complete search history.

(56) References Cited

U.S. PATENT DOCUMENTS

| 5,786,665 A | 7/1998 | Ohtsuki et al. |
| 6,036,328 A | 3/2000 | Ohtsuki et al. |

(Continued)

FOREIGN PATENT DOCUMENTS

| JP | 05-315654 A | 11/1993 | |
| JP | 05315654 A | * 11/1993 | ................... 362/555 |

(Continued)

OTHER PUBLICATIONS

Official Communication issued in International Patent Application No. PCT/JP2006/325363, mailed on Feb. 6, 2007.

(Continued)

*Primary Examiner* — Eric Wong
*Assistant Examiner* — Jerry Blevins
(74) *Attorney, Agent, or Firm* — Keating & Bennett, LLP

(57) ABSTRACT

In a light emitting device, a substrate on which LEDs are arranged in line is used as a light source used for the sidelight of an illuminating apparatus serving as a backlight of sidelight type. The frame of the LED includes a first portion, a second portion, and a third portion. The second and third portions are arranged on both sides of the first portion. The length of the longest part of the first portion in a first direction d1 in which the LEDs are arranged is larger than the length of the longest part of each of the second portion and the third portion. Each of the second portion and the third portion has a part having a length in the first direction d1 shorter than the length a1 of the longest part of the first portion in the first direction d1. Each of the total length b1 of the part of the second portion in which an electrode is disposed and the electrode in the first direction d1 and the total length c1 of the part of the third portion in which the electrode is disposed and the electrode in the first direction d1 is shorter than the length a1.

4 Claims, 7 Drawing Sheets

(56) References Cited

U.S. PATENT DOCUMENTS

| | | | |
|---|---|---|---|
| 6,415,531 B1 | 7/2002 | Ohtsuki et al. | |
| 2002/0114152 A1* | 8/2002 | Fujino et al. | 362/31 |
| 2004/0201987 A1 | 10/2004 | Omata | |
| 2005/0072981 A1* | 4/2005 | Suenaga | 257/88 |

FOREIGN PATENT DOCUMENTS

| | | | | |
|---|---|---|---|---|
| JP | 2002-223005 A | | 8/2002 | |
| JP | 2002223005 A | * | 8/2002 | 362/555 |
| JP | 2003-318448 A | | 11/2003 | |
| JP | 2004-327955 A | | 11/2004 | |
| JP | 2005-039177 A | | 2/2005 | |
| JP | 2005-077691 A | | 3/2005 | |

OTHER PUBLICATIONS

"Power Light Source," Luxeon DCC Technical Datasheet DS48, Oct. 21, 2003, pp. 1-16.

* cited by examiner

LIGHT EMITTING DEVICE, ILLUMINATING APPARATUS HAVING THE SAME, AND LIQUID CRYSTAL DISPLAY APPARATUS

BACKGROUND OF THE INVENTION

1. Field of the Invention

The present invention relates to a surface mount type LED that serves as a light emitting device, an illuminating apparatus having the same, and a liquid crystal display apparatus.

2. Description of the Related Art

In recent years, display apparatuses using a liquid crystal panel, which is thinner than a CRT (cathode ray tube), have been widely used. The liquid crystal panel, not emitting light itself, displays an image by using external light or by being irradiated with light emitted from an illuminating apparatus.

As for examples of illuminating apparatuses for use in liquid crystal display apparatus, there is the sidelight type backlight proposed in JP-A-H08-315621 (Page 8, FIG. 2). This is used by being placed behind a liquid crystal panel, and formed of a flat acrylic resin plate called a light guide plate and a sidelight that includes LEDs (light emitting diodes) arranged in line and that is disposed on a lateral surface of the light guide plate to serve as a light source. Light emitted from the LEDs is reflected inside the light guide plate, and is then emitted from an emitting surface formed on a top surface of the light guide plate to illuminate the liquid crystal panel.

In the backlight proposed in JP-A-H08-315621, the sidelight is formed of a substrate and bullet type LEDs arranged in a line on the substrate. These LEDs are each connected to the substrate by lead frames serving as electrodes. As shown in FIG. 17, which is a schematic structure diagram, an LED 140, which is a bullet type LED, is covered by a bullet-shaped frame 147 made of transparent resin and two electrodes 143 extend perpendicularly from the bottom surface of the frame 147. Thus, since the LEDs 140 can be arranged such that the frames 147 are in contact with one another, a larger number of the LEDs 140 can be arranged, and this helps make the brightness of the backlight high. In addition, since the LEDs 140 each occupy only a small area on the substrate, the substrate which is used as the side light can be small in size. As a result, the backlight can be smaller and thinner in size.

In addition to the bullet type LED used in the backlight of JP-A-H08-315621, a surface mount type LED used in the light source shown in "High Power Light Source Luxeon DCC Technical Data Sheet DS48" (on-line), published in 2003 by Lumileds Lighting Company, (retrieved in Apr. 4, 2006), Internet <URL: http://www.lumileds.com/pdfs/DS48#JA.PDF>, can also be used in a backlight. The surface mount type LED is mounted on a substrate to be in contact therewith, and thus, heat generated thereby can be dissipated via the substrate. This makes the surface mount type LED excellent in heat dissipation, and as a result, increase in the temperature of the surface mount type LED can be reduced even when the surface mount type LED generates heat by being energized; thus, even in a case where the amount of current is increased so as to improve the brightness of the surface mount type LED or in a case where the surface mount type LED is energized for a long time, the surface mount type LED can emit light in a stable manner. Hence, the brightness of light emitted from the backlight can be increased in a stable manner, and this allows the liquid crystal display apparatus to perform display of higher quality.

Since the bullet type LED used in the backlight of JP-A-H08-315621 is in contact with the substrate only at its lead frames, the backlight of JP-A-H08-315621 is poor in heat dissipation, and when it is energized for a long time, the color and the brightness of light emitted therefrom may change. On the other hand, in the surface mount type LED used in the backlight of "High Power Light Source Luxeon DCC Technical Data Sheet DS48", an electrode is formed to project from a lateral side of a frame so as to be in contact with a substrate surface, and thus the LEDs need to be widely spaced from one another and a large substrate needs to be used.

For example, in a case where LEDs 140 are arranged so as to reduce the width of the substrate 132 in the up/down direction of the figure surface as shown in FIGS. 18 and 19 which are plan views each to show a substrate on which conventional surface mount type LEDs are mounted, a wider space needs to be formed between adjacent ones of the LEDs 140 for placing electrodes 143, and this causes a backlight having this substrate 132 as the light source to emit light of low brightness. At this point, the LEDs 140 in FIG. 18 are top-view type LEDs that emit light in a direction perpendicular to the substrate 132, and the LEDs 140 in FIG. 19 are top-view type LEDs or side-view type LEDs that emit light in a direction parallel to the substrate 132.

On the other hand, in a case where, as shown in FIG. 20 where conventional surface mount type LEDs are mounted on a substrate, the LEDs 140 are arranged so as to reduce the space between adjacent ones of the LEDs 140 which are top-view type LEDs, a larger number of LEDs 140 can be arranged, and this allows a backlight to emit light of high brightness. However, the width of the substrate 132 in the up/down direction of the figure surface is formed wider for placing the electrodes 143, and this causes a backlight having this substrate 132 to be formed thick. As a result, it is difficult to achieve slimness of the backlight. Incidentally, side-view type LEDs cannot be arranged in this manner.

SUMMARY OF THE INVENTION

In order to overcome the problems described above, preferred embodiments of the present invention provide a surface mount type LED, which is a light emitting device that can be disposed in a small area on a substrate, a high-brightness illuminating apparatus having this LED, and a liquid crystal display apparatus capable of performing display of high quality.

According to a preferred embodiment of the present invention, a light emitting device includes: a light emitting portion having a light emitting element and two electrodes connected to the light emitting element; and a box-shaped frame that encloses the light emitting element of the light emitting portion. Here, the frame is provided with an attaching surface at which the frame is in contact with a substrate; an electrode disposing surface that is perpendicular or substantially perpendicular to the attaching surface and on which the electrodes are disposed; and a light emitting surface that faces either the electrode disposing surface or the attaching surface.

According to a preferred embodiment of the present invention, in the light emitting device structured as described above, the electrodes may be each disposed from the electrode disposing surface to the attaching surface.

According to another preferred embodiment of the present invention, a light emitting device includes: a light emitting portion having a light emitting element and two electrodes connected to the light emitting element; and a frame that encloses the light emitting element of the light emitting portion. Here, the frame has an attaching surface at which the frame is in contact with a substrate; the attaching surface includes a first portion, a second portion, and a third portion; the first portion is sandwiched between the second and the third portions; a length of a longest part of the first portion in a first direction is equal to or longer than lengths of longest parts of the second and the third portions in the first direction, the first direction being a direction parallel or substantially parallel to the attaching surface; the second and the third portions each have a part having a length in the first direction shorter than the length of the longest part of the first portion in the first direction; the electrodes are disposed one-to-one on the second and the third portions, and a part of each of the electrodes is located inside the attaching surface in a second direction that is perpendicular or substantially perpendicular to the first direction; and a length in the first direction that is a total of a length of a part of the second portion of the attaching surface in which the one of the electrodes is disposed and a length of the one of the electrodes in the first direction and a length in the first direction that is a total of a length of a part of the third portion in which the other one of the electrodes is disposed and a length of the other one of the electrodes in the first direction are both shorter than the length of the longest part of the first portion in the first direction.

According to a preferred embodiment of the present invention, in the light emitting device structured as described above, the attaching surface has a shape obtained by cutting off four corners of a rectangle or a square such that a portion of each side of at least one of two pairs of parallel sides remains without being cut off; the first direction is perpendicular or substantially perpendicular to a pair of parallel sides of the rectangle or the square a portion of each side of which remains without being cut off; and the electrodes are disposed on sides adjacent to the pair of parallel sides that are perpendicular or substantially perpendicular to the first direction.

According to a preferred embodiment of the present invention, in the light emitting device structured as described above, the shape obtained by cutting off the four corners of the rectangle or the square may be a hexagon or an octagon.

According to a preferred embodiment of the present invention, in the light emitting device structured as described above, the attaching surface may have a circular or substantially circular shape.

According to a preferred embodiment of the present invention, in the light emitting device structured as described above, the first portion, the second portion, and the third portion of the attaching surface may each have a rectangular or substantially rectangular shape.

According to a preferred embodiment of the present invention, in the light emitting device structured as described above, the frame may have a shape of a prism, one base thereof being the attaching surface.

According to a preferred embodiment of the present invention, in the light emitting device structured as described above, the light emitting portion may include three light emitting portions: one in which the light emitting element emits red light; one in which the light emitting element emits green light; and one in which the light emitting element emits blue light.

According to another preferred embodiment of the present invention, an illuminating apparatus includes: a light guide plate that is arranged to allow light it has received through a lateral surface thereof to propagate therethrough and to emit light from an emitting surface thereof, and the light emitting device structured as described above arranged in line so as to emit light toward the lateral surface of the light guide plate.

According to another preferred embodiment of the present invention, an illuminating apparatus includes the light emitting device structured as described above arranged in the first and the second directions on the substrate in a plane state.

According to another preferred embodiment of the present invention, a liquid crystal display apparatus includes: a liquid crystal panel; and the illuminating apparatus structured as described above that irradiates the liquid crystal panel with light from behind.

According to various preferred embodiments of the present invention, in a case where LEDs are arranged in a line on a substrate, a distance between adjacent ones of the LEDs can be so short that frames of adjacent ones of the LEDs are in contact with each other without electrodes of each of the LEDs being caused to be in contact with a frame of another one of the LEDs, and this makes it possible to increase a number of LEDs to be mounted on the substrate. Thus, the brightness of an illuminating apparatus having, as a light source, the substrate with these LEDs mounted thereon can be high, and a liquid crystal display apparatus provided with this illuminating apparatus can perform display of improved quality.

According to a preferred embodiment of the present invention, in a case where LEDs are arranged in a line on a substrate, the distance between adjacent ones of the LEDs can be so short that the frames of adjacent ones of the LEDs are in contact with each other without the electrodes of each of the LEDs being caused to be in contact with the frame of another one of the LEDs, and the width of the substrate can be substantially as narrow as the width of the LEDs in a direction perpendicular or substantially perpendicular to the direction of the line of the LEDs. Thus, a sidelight type illuminating apparatus having as a light source the substrate having these LEDs can be both thin and improved in brightness, and a liquid crystal display apparatus having this illuminating apparatus can also be both thin and improved in brightness. In a case where the LEDs are arranged in a plane state on a substrate, too, the distance between adjacent ones of the LEDs can be so short that the frames of adjacent ones of the LEDs are in contact with each other without the electrodes of each of the LEDs being caused to be in contact with the frame of another one of the LEDs, and thus an increased number of LEDs can be mounted. This helps raise the brightness of an illuminating apparatus having as a light source the substrate provided with these LEDs.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1:
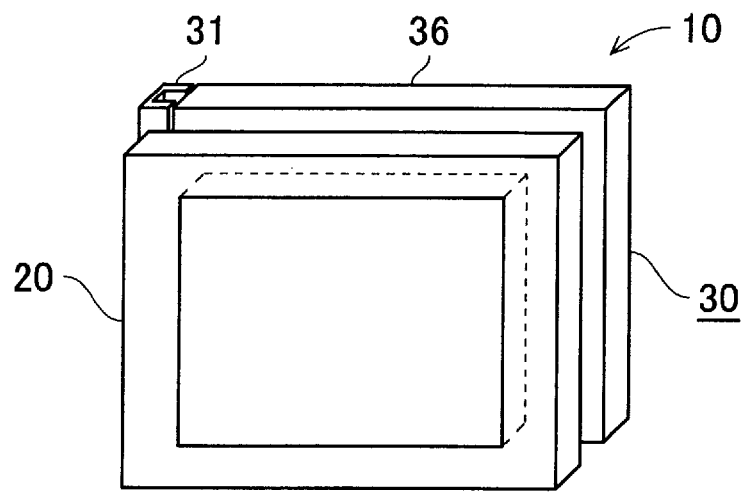
FIG. 1 is a diagram schematically to show the structure of a liquid crystal display apparatus of a first preferred embodiment of the present invention.
Figure 4:
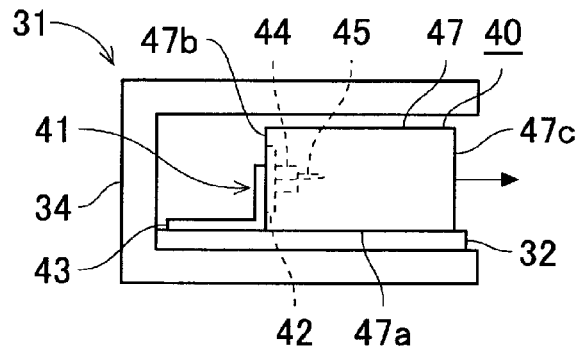
FIG. 4 is a front view to show a light source portion of the first preferred embodiment of the present invention.
Figure 5:
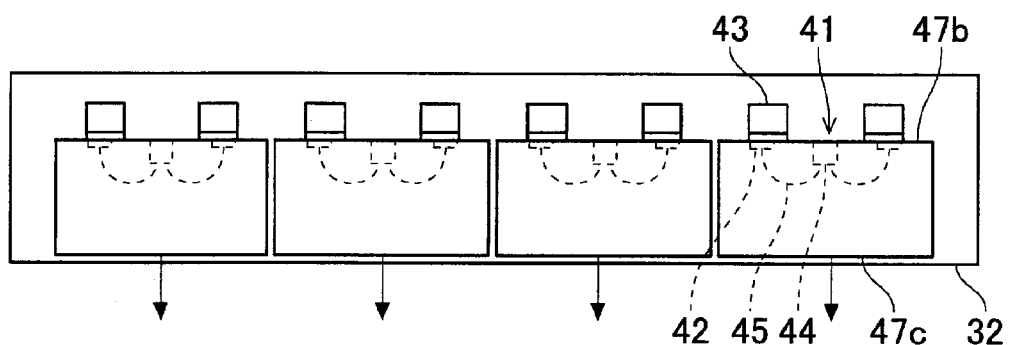
FIG. 5 is a plan view to show a substrate provided with LEDs of the first preferred embodiment of the present invention.

A description will be given of a first preferred embodiment of the present invention with reference to the drawings. FIG. 1 is a diagram schematically to show the structure of a liquid crystal display apparatus of the first preferred embodiment, FIG. 2 is a plan view to show a backlight as an illuminating apparatus of the first preferred embodiment, FIG. 3 is a front view to show the backlight, FIG. 4 is a front view to show a light source portion of the first preferred embodiment, and FIG. 5 is a plan view to show a substrate provided with LEDs of the first preferred embodiment.

As shown in FIG. 1, a liquid crystal display apparatus 10 is provided with a liquid crystal panel 20 and a backlight 30. The liquid crystal panel 20 is provided with a TFT substrate, a counter substrate, and liquid crystal sealed between the TFT substrate and the counter substrate; the alignment of the liquid crystal is controlled by applying a voltage between the two substrates, and thereby the liquid crystal panel 20 displays an image. The backlight 30 is placed behind the liquid crystal panel 20, and emits white light from an emitting surface thereof so as to irradiate the image displayed on the liquid crystal panel 20 with the white light.

Figure 2:
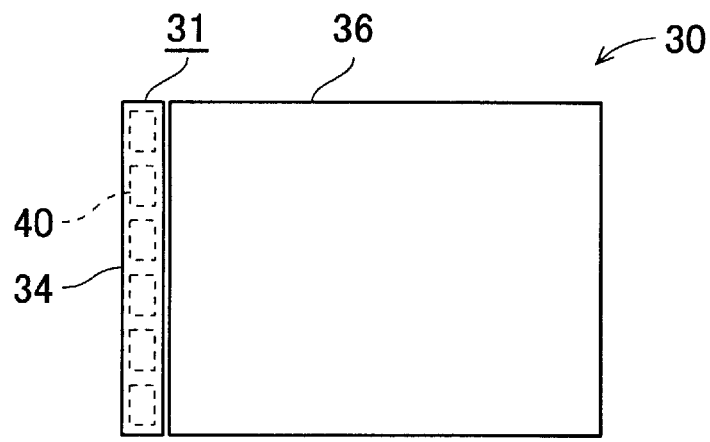
FIG. 2 is a plan view to show a backlight of the first preferred embodiment of the present invention.
Figure 3:
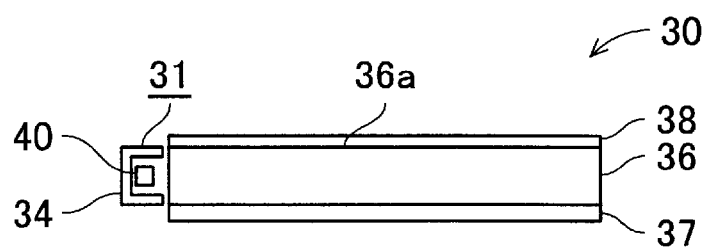
FIG. 3 is a front view to show the backlight of the first preferred embodiment of the present invention.

As shown in FIG. 2 and FIG. 3, the backlight 30 is a sidelight type backlight and is provided with a light source portion 31, a light guide plate 36, and a reflective plate 37. As shown in FIG. 4 and FIG. 5, the light source portion 31 is provided with a reflector 34 and LEDs 40 arranged in a line on a substrate 32 inside the reflector 34, and is positioned such that light emitted from the LEDs 40 enters the light guide plate 36 through a lateral surface thereof. The reflective plate 37 is disposed so as to face a surface of the light guide plate 36 that is located opposite to a surface thereof that faces the liquid crystal panel 20. Furthermore, on an emitting surface 36a, which is the liquid crystal panel 20 facing surface of the light guide plate 36, an optical sheet 38 is arranged so as to scatter light emitted from the emitting surface 36a.

Light emitted from an LED chip 44 provided in each of the LEDs 40 as a light emitting element enters the lateral surface of the light guide plate 36 via an opening of the reflector 34 directly from the LEDs 40 or after being reflected by an inner surface of the reflector 34 to propagate through the inside of the light guide plate 36, and then the light is emitted as white light from the emitting surface 36a, which faces the liquid crystal panel 20, and is then scattered by the optical sheet 38. Light emitted from the light guide plate 36 to the reflective plate 37 side reenters the light guide plate 36 by being reflected by the reflective plate 37, and propagates through the inside of the light guide plate 36.

In this preferred embodiment, the LEDs 40 are each provided with a light emitting portion 41 and a frame 47 formed of resin; they are side-view type LEDs that emit light in a direction perpendicular or substantially perpendicular to a surface on which they are mounted, and they are also surface mount type LEDs that are mounted on the substrate 32 in contact therewith. The light emitting portion 41 has two lead frames 42, two electrodes 43 connected one-to-one to the lead frames 42, and an LED chip 44 as a light emitting element. The two electrodes 43 are an anode and a cathode. Inside the frame 47, the LED chip 44 is connected to each of the lead frames 42 by a bonding wire 45 made of, for example, gold. The frame 47 is designed to cover the LED chip 44 and the lead frames 42 of the light emitting portion 41 such that the electrodes 43 are exposed. The frame 47 includes: an attaching surface 47a at which the frame 47 is in contact with the substrate 32; an electrode disposing surface 47b that is perpendicular to the attaching surface 47a and from which both of the electrodes 43 project; and a light emitting surface 47c from which light is emitted and that is formed on a surface of the frame 47 that is opposite to the electrode disposing surface 47b. That is, neither of the electrodes 43 is disposed on the surface of each one of the LEDs 40 that faces a surface of an adjacent one of the LEDs 40. The electrodes 43 are connected to a conductor (not shown) formed on the substrate 32. The electrodes 43 are used to achieve connection with a power supply (not shown) and connection between adjacent ones of the LEDs 40. The LEDs 40 are arranged on the substrate 32, which is disposed inside the reflector 34, to be connected in series or in parallel to one another by the conductor formed on the substrate 32. Connection among the LEDs 40 may be achieved by connecting some LED groups in parallel to one another, each of the LED groups being composed of some of the LEDs 40 connected in series to one another.

With this structure, the distance between adjacent ones of the LEDs 40 can be made so short that they come in contact with each other, and accordingly, a larger number of the LEDs 40 can be mounted in the light source portion 31. This helps improve the brightness of light emitted from the light source portion 31 and from the emitting surface 36a of the light guide plate 36, and as a result, the display quality of the liquid crystal display apparatus 10 can be improved. In FIG. 5, a gap is formed between adjacent ones of the LEDs 40; however, they may be in contact with each other to eliminate the gap.

Since the LEDs 40 are surface mount type LEDs, heat generated thereby can be dissipated through the substrate 32; thus, the amount of current can be increased to improve the brightness of the LEDs 40, and the LEDs 40 can continue to emit light in a stable manner even when they are energized for a long time. Thus, in this way, too, the brightness of light emitted from the light source portion 31 and from the emitting surface 36a of the light guide plate 36 can be improved, and thereby the display quality of the liquid crystal display apparatus 10 can also be improved.

Figure 6:
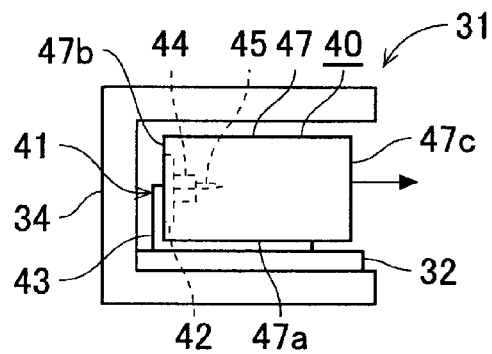
FIG. 6 is a front view to show another example of the light source portion of the first preferred embodiment of the present invention.

In this preferred embodiment, as shown in FIG. 6, the two electrodes 43 may be mounted by being bent such that they are disposed partially on the electrode disposing surface 47b and partially on the attaching surface 47a to be sandwiched between the attaching surface 37a and the substrate 32. This makes it possible to make the substrate 32 compact, to reduce the height of the light source portion 31, and to reduce the thickness of the backlight 30. As a result, it is also possible to reduce the thickness of the liquid crystal display apparatus 10.

Figure 7:
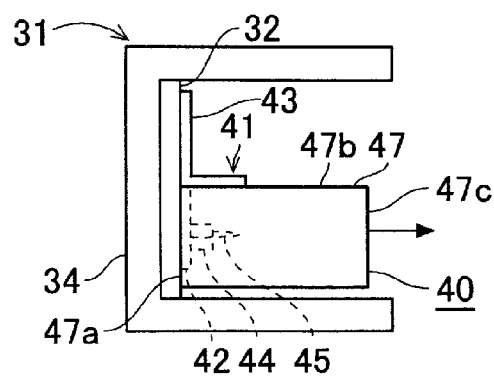
FIG. 7 is a front view to show another example of the light source portion of the first preferred embodiment of the present invention.

In this preferred embodiment, the LEDs 40 may be top-view type LEDs, in each of which the light emitting surface 47c is formed to face the attaching surface 47a. In this case, as shown in FIG. 7, it is preferable that the substrate 32 be disposed on a surface that is perpendicular or substantially perpendicular to the opening of the reflector 34. In this case, too, the electrodes 43 may each be mounted by being bent such that they are disposed partially on the electrode disposing surface 47b and partially on the attaching surface 47a to be sandwiched between the attaching surface 37a and the substrate 32.

Second Preferred Embodiment

Figure 8A:
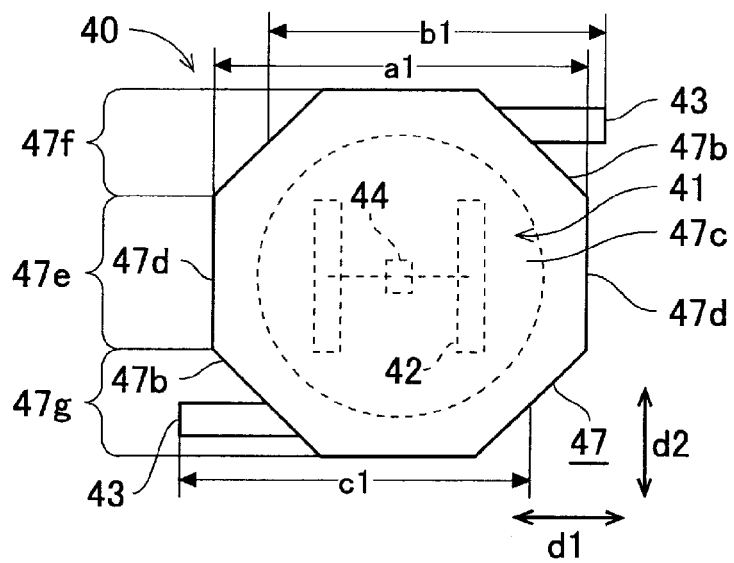
FIG. 8A is a plan view to show an LED of a second preferred embodiment of the present invention.
Figure 8B:
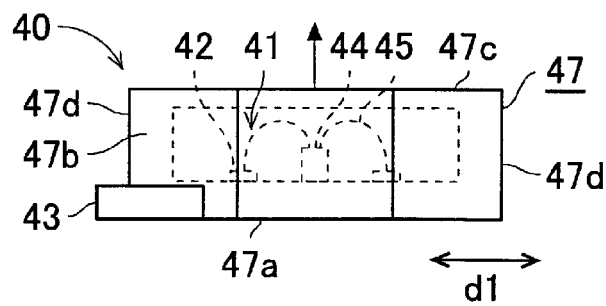
FIG. 8B is a front view to show the LED of the second preferred embodiment of the present invention.
Figure 8C:
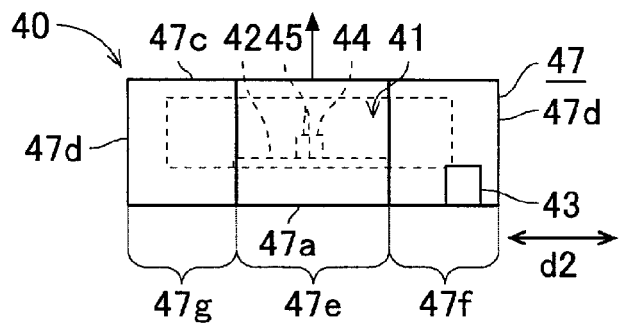
FIG. 8C is a side view to show the LED of the second preferred embodiment of the present invention.
Figure 9:
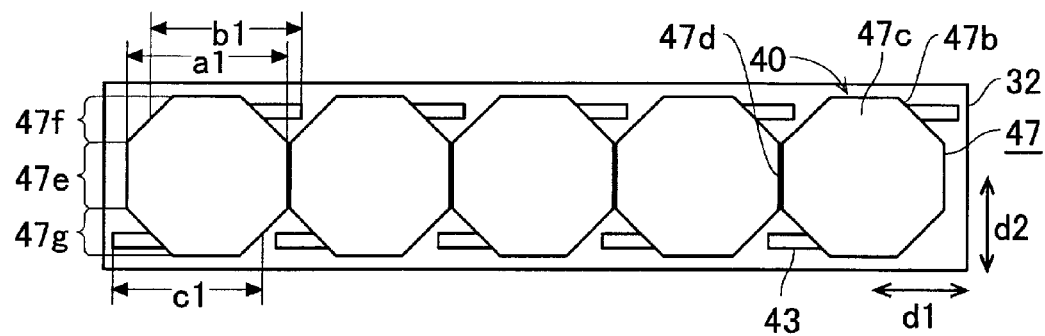
FIG. 9 is a plan view to show a substrate provided with the LED of the second preferred embodiment of the present invention.

Next, a description will be given of a second preferred embodiment of the present invention with reference to the drawings. FIG. 8A is a plan view to show an LED of the second embodiment, FIG. 8B is a plan view, FIG. 8C is a side view, and FIG. 9 is a plan view to show a substrate of the second preferred embodiment. The second preferred embodiment is similar to the first preferred embodiment except that the LEDs are different in structure, and the portions thereof that are practically the same as those of the first preferred embodiment are denoted by the same reference numerals.

As shown in FIGS. 8A, 8B, and 8C, the LEDs 40 of this preferred embodiment are each provided with the light emitting portion 41 and the frame 47 formed of white resin. The light emitting portion 41 has the two lead frames 42, the two electrodes 43 that are an anode and a cathode and connected one-to-one to the lead frames 42, and the LED chip 44, which is a light emitting element. Inside the frame 47, the LED chip 44 is connected to each of the two lead frames 42 by the bonding wire 45, and the inside of the frame 47 is filled with transparent resin. The frame 47 is designed to cover the light emitting portion 41 such that only the electrodes 43 of the light emitting portion 41 are exposed.

The frame 47 of each of the LEDs 40 has a shape of a regular octagonal prism, one base thereof being the attaching surface 47a that is in contact with the substrate 32, and the other base being the light emitting surface 47c from which light is emitted. As shown in FIG. 9, the LEDs 40 are arranged adjacent to one another on the substrate 32 such that a lateral surface of each one of the LEDs 40 faces a lateral surface of an adjacent one of the LEDs 40, and that the two electrodes are disposed one-to-one on the electrode disposing surfaces 47b, which are lateral surfaces adjacent to lateral surfaces 47d that face each other. The lateral surfaces 47d are two surfaces of the regular octagonal prism that are positioned opposite and parallel to each other, and so are the electrode disposing surfaces 47b. Thus, the direction that is perpendicular to the lateral surfaces 47d and the direction in which the LEDs 40 are arranged on the substrate 32 are the same. This direction will be referred to as a first direction d1, and the direction perpendicular to the first direction d1 will be referred to as a second direction d2.

A portion of the frame 47 sandwiched between the lateral surfaces 47d will be referred to as a first portion 47e, and portions that are adjacent to the first portion 47e will be respectively referred to as a second portion 47f and a third portion 47g. Thus, in the frame 47, a length a1 of the longest part of the first portion 47e in the first direction d1 is equal to or longer than lengths of the longest parts of the second portion 47f and the third portion 47g in the first direction d1; and the second portion 47f and the third portion 47g each have a part having a length in the first direction d1 that is shorter than the length a1. A length b1 in the first direction d1 that is a total of the length of a part of the second portion 47f in which one of the electrodes 43 is disposed and the length of the one of the electrodes 43 in the first direction d1 and a length c1 in the first direction d1 that is a total of the length of a part of the third portion 47g in which the other one of the electrodes 43 is disposed and the length of the other one of the electrodes 43 in the first direction d1 are both shorter than the length a1.

With this structure, the LEDs 40 can be arranged in a line so close to one another that the frames 47 are in contact with one another without causing the electrodes 43 of any one of the LEDs 40 to come in contact with the frame 47 of an adjacent one of the LEDs 40. This makes it possible to densely arrange the LEDs 40, and thus to increase the number of the LEDs 40 to be mounted in the light source portion 31. As a result, the brightness of light emitted from the emitting surface 36a of the light guide plate 36 can be improved, and thereby the display quality of the liquid crystal display apparatus 10 can be improved.

Since the LEDs 40 are surface mount type LEDs that excel in heat dissipation, the amount of current can be increased to improve the brightness of light emitted from the light source portion 31 and from the emitting surface 36a of the light guide plate 36, and thereby the display quality of the liquid crystal display apparatus 10 can be improved.

In each of the LEDs 40, the two electrodes 43 are disposed such that they do not project out of the frame 47 in the second direction d2. This helps minimize the width of the substrate 32 in the second direction d2 and lower the height of the reflector 34, and thus contributes to the slimming down of the backlight 30, and consequently, to the slimming down of the liquid crystal display apparatus 10.

Figure 10:
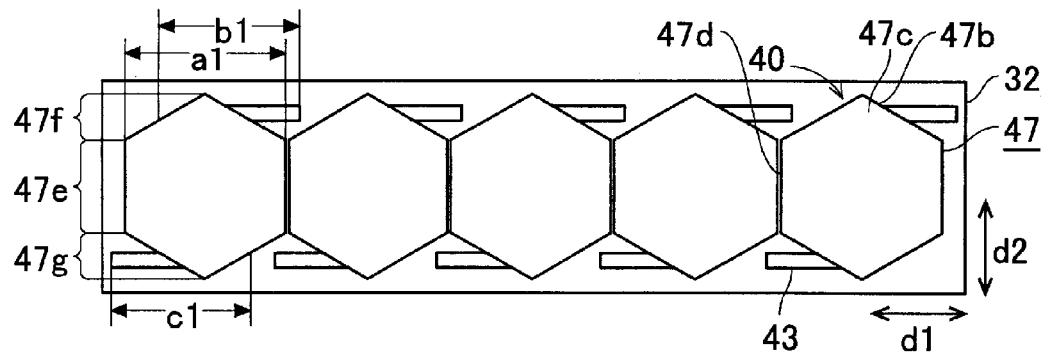
FIG. 10 is a plan view to show a substrate provided with another example of the LED of the second preferred embodiment of the present invention.

The LEDs 40 of this preferred embodiment offer the same advantage as described above even when the frame 47 has a shape of a regular hexagonal prism as shown in FIG. 10. In this case, as in a case where the frame 47 has a shape of a regular octagonal prism, the LEDs 40 are arranged adjacent to one another such that a lateral surface of each one of the LEDs 40 faces a lateral surface of an adjacent one of the LEDs 40, and that the electrodes are disposed one-to-one on the electrode disposing surfaces 47b, which are lateral surfaces adjacent to the lateral surfaces 47d that face each other. The lateral surfaces 47d and the electrode disposing surfaces 47b are each composed of two surfaces of the regular hexagonal prism that are positioned opposite and parallel to each other. The first portion 47e is a portion sandwiched between the lateral surfaces 47d of the frame 47, and the second portion 47f and the third portion 47g are portions adjacent to the first portion 47e.

Figure 11:
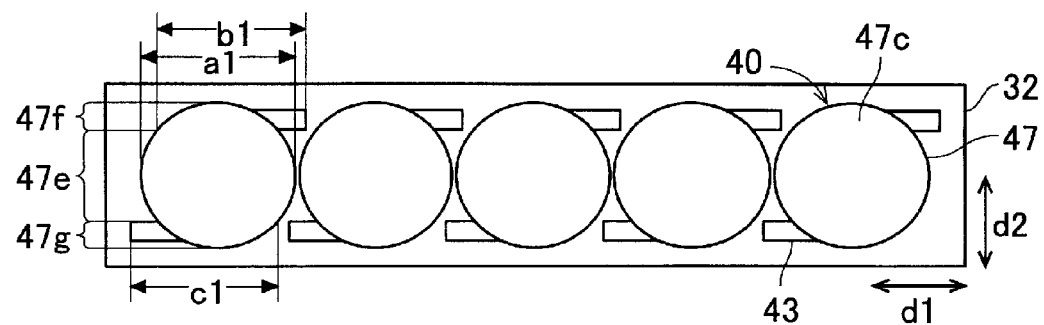
FIG. 11 is a plan view to show a substrate provided with other example of the LED of the second preferred embodiment of the present invention.

The LEDs 40 of this preferred embodiment offer the same advantages as described above even when the frame 47 has a shape of a cylinder as shown in FIG. 11. In this case, the first portion 47e is a portion that has a certain width and includes the diameter, and the second portion 47f and the third portion 47g are portions adjacent to the first portion 47e on which the electrodes 43 are disposed one-to-one. That is, as in a case where the frame 47 has a shape of a regular octagonal prism, the length a1 of the longest part of the first portion 47e in the first direction d1 is equal to or longer than the lengths of the longest parts of the second portion 47f and the third portion 47g in the first direction d1; and the second portion 47f and the third portion 47g each have a part having a length in the first direction d1 that is shorter than the length a1. The length b1 in the first direction d1 that is the total of the length of the part of the second portion 47f in which one of the electrodes 43 is disposed and the length of the one of the electrodes 43 in the first direction d1 and the length c1 in the first direction d1 that is the total of the length of the part of the third portion 47g in which the other one of the electrodes 43 is disposed and the length of the other one of the electrodes 43 in the first direction d1 are both shorter than the length a1. The two electrodes 43 are disposed one-to-one on the second portion 47f and the third portion 47g such that they do not project out of the frame 47 in the second direction d2.

Figure 12:
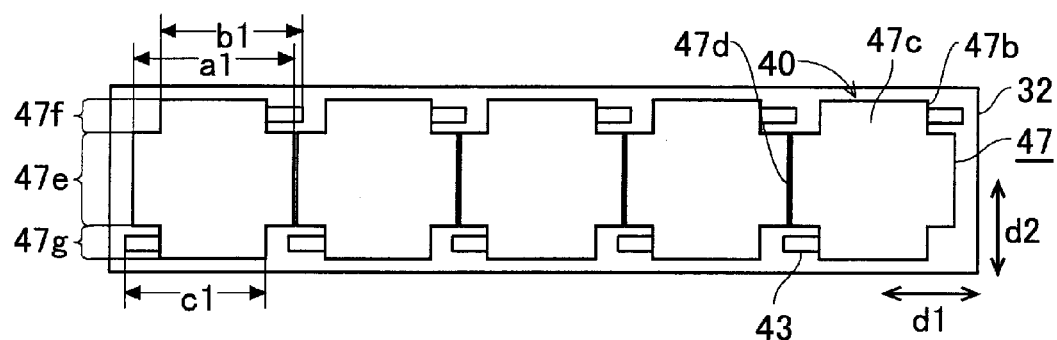
FIG. 12 is a plan view to show a substrate provided with still other example of the LED of the second preferred embodiment of the present invention.

In this preferred embodiment, the LEDs 40 may have a shape of a prism formed such that the attaching surface 47a is cross-shaped as shown in FIG. 12. In this case, as long as portions of the attaching surface 47a corresponding to the first portion 47e, the second portion 47f, and the third portion 47g each have a rectangular or substantially rectangular shape, the attaching surface 47 as a whole does not necessarily need to be cross-shaped.

Figure 13:
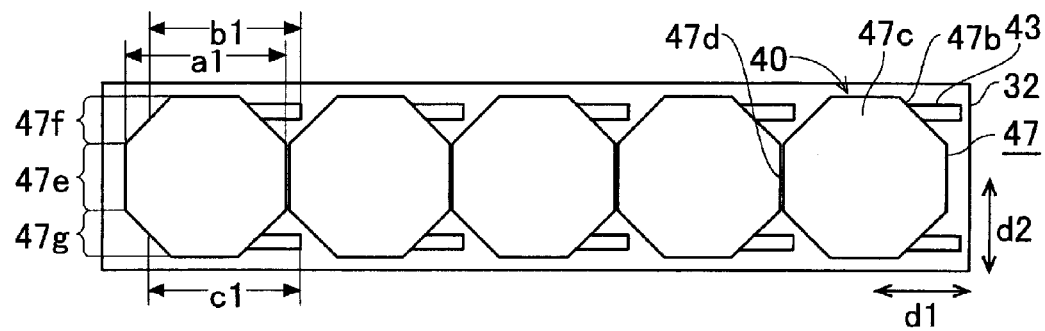
FIG. 13 is a plan view to show a substrate provided with still other example of the LED of the second preferred embodiment of the present invention.

The description hitherto given has dealt with the case where the two electrodes 43 are arranged to be symmetrical to each other with respect to the substantial center of the frame 47, but in this preferred embodiment, the LEDs 40 may each be formed such that the two electrodes 43 are arranged to be symmetrical to each other with respect to the first portion 47e as shown in FIG. 13.

Figure 14:
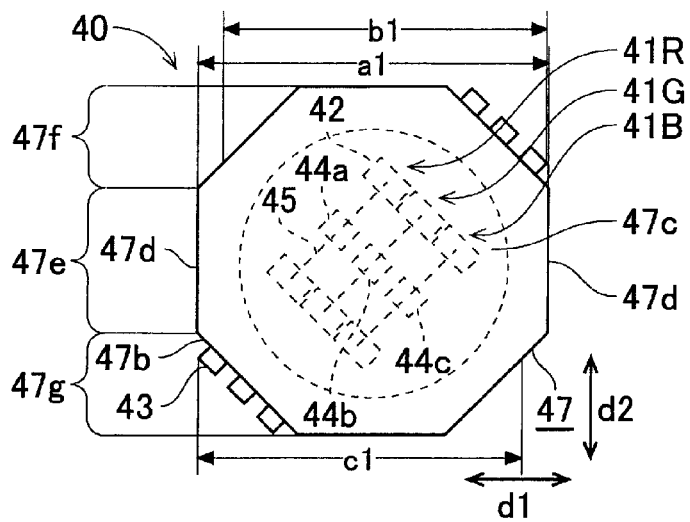
FIG. 14 is a plan view to show still other example of the LED of the second preferred embodiment of the present invention.

In this preferred embodiment, the LEDs 40 may each have three light emitting portions 41R, 41G, and 41B as shown in FIG. 14. The light emitting portions 41R, 41G, and 41B each have the two lead frames 42, the two electrodes 43 each connected one-to-one to the two lead frames 42, and LED chips 44R, 44G, and 44B that emit light of R, G, and B, respectively.

In this case, inside the frame 47, the LED chips 44R, 44G, and 44B of the light emitting portions 41R, 41G, and 41B, respectively, are independently connected to each of the two lead frames 42 by the bonding wire 45. The brightness and the color of each of the LED chips 44R, 44G, and 44B is chosen such that desired white light is emitted from the frame 47 when all of them simultaneously emit light. Inside the reflector 34 of the light source portion 31, the electrodes 43 of same-colored ones of the light emitting portions 41R, 41G, and 41B of any two adjacent ones of the LEDs 40 are connected to each other directly or by a conductor formed on the substrate 32.

Figure 15:
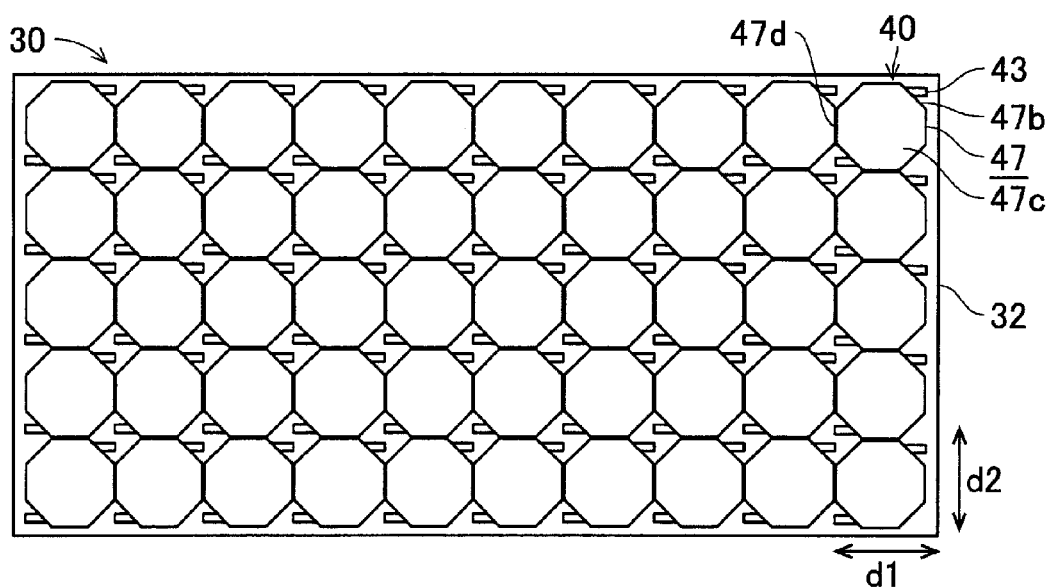
FIG. 15 is a plan view to show still other example of a backlight of the second preferred embodiment of the present invention.

In this preferred embodiment, the backlight 30 may be a direct backlight in which the LEDs 40 are arranged in a plane state on the substrate 32 as shown in FIG. 15. This makes it possible to mount a larger number of the LEDs 40 than in a sidelight type backlight by densely arranging the LEDs 40. As a result, high brightness of the backlight 30 can be obtained and the display quality of the liquid crystal display apparatus 10 can be improved. FIG. 15 shows the case where the frame 47 of each of the LEDs 40 has a shape of a regular octagonal prism, but it may have a shape of a regular hexagonal prism, a cylinder, or a prism in which the attaching surface 47a is cross-shaped.

In this preferred embodiment, the frame 47 may have a shape other than those illustrated above as examples as long as the first portion 47e, the second portion 47f, the third portion 47g, and the electrodes 43 fulfill the above described conditions.

Figure 16:
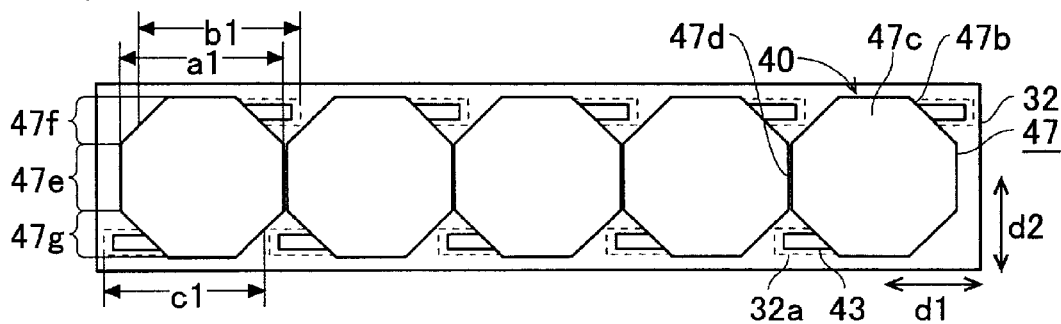
FIG. 16 is a plan view to show a substrate provided with another example of the LED of the second preferred embodiment of the present invention.
Figure 17:
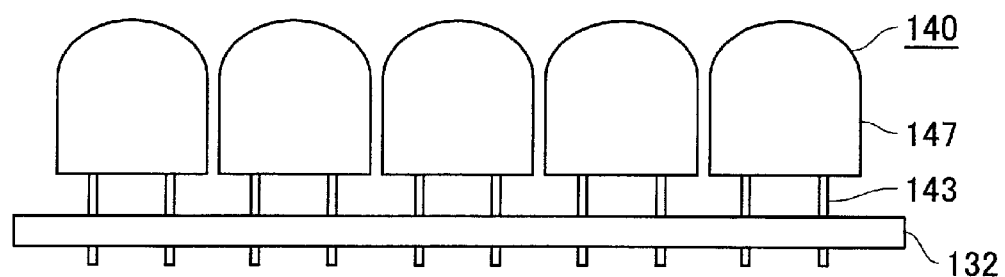
FIG. 17 is a plan view to show a substrate provided with a conventional LED.
Figure 18:
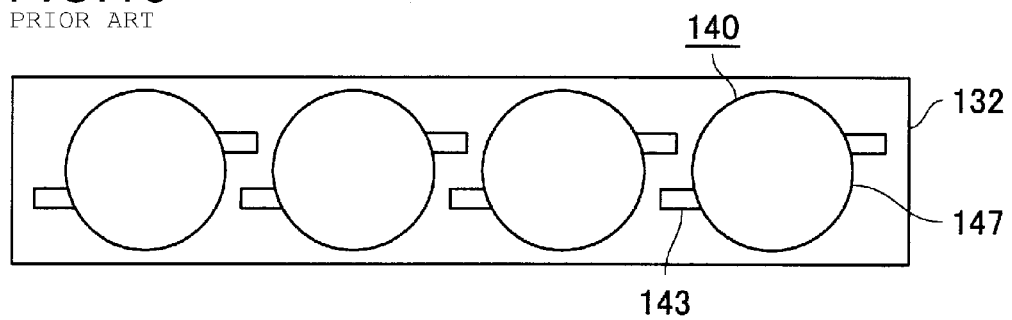
FIG. 18 is a plan view to show a substrate provided with another conventional LED.
Figure 19:
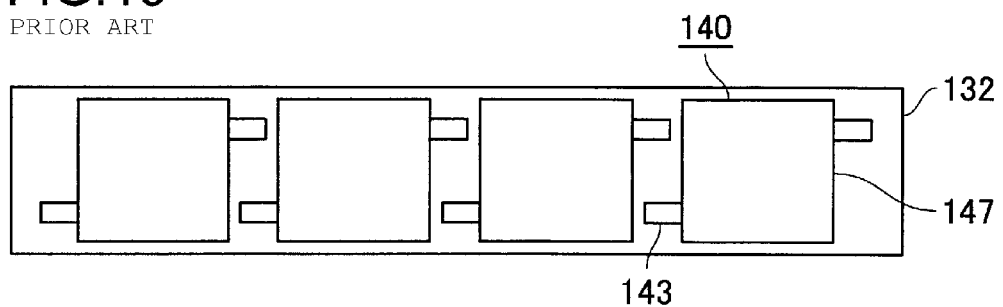
FIG. 19 is a plan view to show a substrate provided with other conventional LED.
Figure 20:
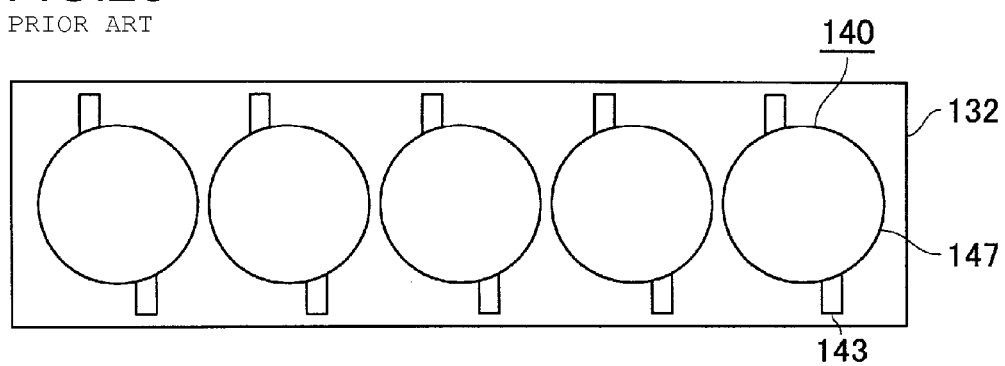
FIG. 20 is a plan view to show a substrate provided with a still other conventional LED.

In the first and the second preferred embodiments, in a case where, as shown in FIG. 16, mount pattern areas where the electrodes 43 are disposed on the substrate 32 need to be larger than the electrodes 43, it is preferable that the length b1 in the first direction d1, which is here a total of the length of the part of the second portion 47f in which one of the electrodes 43 is disposed and the length of a mount pattern area 32a in the first direction and the length c1 in the first direction d1, which is here a total of the length of the part of the third portion 47g in which the other one of the electrodes 43 is disposed and the length of the mount pattern area 32a in the first direction be both shorter than the length a1.

The numbers of LEDs shown in the drawings are examples, and the number of LEDs may be changed as necessary according to an LED size, a substrate size, or the like.

The present invention is applicable to a surface mount type LED and an illuminating apparatus having this LED, and this illuminating apparatus can be used, for example, as a backlight of a liquid crystal display apparatus.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A light emitting device, comprising:
    a frame which has a rectangular parallelepiped shape and is arranged to transmit light;
    a light emitting element provided within the frame; and
    at least two electrodes connected to the light emitting element; wherein the frame includes:
        an attaching surface at which the frame is in contact with a substrate;
        an electrode disposing surface that is substantially perpendicular to the attaching surface and on which the at least two electrodes are disposed; and
        a light emitting surface that faces either the electrode disposing surface or the attaching surface; and
    the at least two electrodes are arranged within the frame such that the at least two electrodes do not contact any surface of the frame other than the electrode disposing surface.

2. A light emitting device comprising:
    a frame which has a rectangular parallelepiped shape and is arranged to transmit light;
    a light emitting element provided within the frame; and
    at least two electrodes connected to the light emitting element;
    wherein
    the frame includes:
        an attaching surface which is arranged above a substrate;
        an electrode disposing surface that is substantially perpendicular to the attaching surface and on which the at least two electrodes are disposed; and a light emitting surface that faces either the electrode disposing surface or the attaching surface; and the at least two electrodes are each arranged to extend from the electrode disposing surface to the attaching surface, and the at least two electrodes are arranged within the frame such that the at least two electrodes do not contact any surface of the frame other than the electrode disposing surface.

3. An illuminating apparatus, comprising:

a light guide plate that is arranged to allow light it has received through a lateral surface thereof to propagate therethrough and to emit light from an emitting surface thereof; and the light emitting device according to claim 1 arranged in line so as to emit light toward the lateral surface of the light guide plate.

4. A liquid crystal display apparatus, comprising:

a liquid crystal panel; and the illuminating apparatus of claim 3 that irradiates the liquid crystal panel with light from behind.

* * * * *